United States Patent [19]
Yeager et al.

[11] Patent Number: 5,909,624
[45] Date of Patent: Jun. 1, 1999

[54] METHOD OF MAKING INTEGRATION OF HIGH VALUE CAPACITOR WITH FERROELECTRIC MEMORY

[75] Inventors: Michael W. Yeager, Colorado Springs; Dennis R. Wilson, Black Forest, both of Colo.

[73] Assignee: Ramtron International Corporation, Colorado Springs, Colo.

[21] Appl. No.: 08/544,470

[22] Filed: Oct. 18, 1995

Related U.S. Application Data

[63] Continuation of application No. 08/525,497, Sep. 8, 1995, which is a continuation of application No. 08/194,706, Feb. 10, 1994, abandoned.

[51] Int. Cl.$^6$ .................................................. H01L 21/8242
[52] U.S. Cl. ................................................. 438/396; 438/3
[58] Field of Search .......................... 437/47, 48, 49, 437/60, 919

[56] References Cited

U.S. PATENT DOCUMENTS

| | | | |
|---|---|---|---|
| 4,707,897 | 11/1987 | Rohrer et al. | 29/25.42 |
| 4,809,225 | 2/1989 | Dimmler et al. | 365/145 |
| 4,853,893 | 8/1989 | Eaton, Jr. et al. | 365/145 |
| 4,873,664 | 10/1989 | Eaton, Jr. | 365/145 |
| 4,893,272 | 1/1990 | Eaton, Jr. et al. | 365/145 |
| 5,005,102 | 4/1991 | Larson | 361/313 |
| 5,024,964 | 6/1991 | Rohrer et al. | 437/47 |
| 5,075,817 | 12/1991 | Butler | 361/313 |
| 5,109,357 | 4/1992 | Eaton, Jr. | 365/145 |
| 5,142,437 | 8/1992 | Kammerdiner et al. | 361/313 |
| 5,162,890 | 11/1992 | Butler | 257/306 |
| 5,166,545 | 11/1992 | Harrington | 307/272.3 |
| 5,191,510 | 3/1993 | Huffman | 361/313 |
| 5,206,788 | 4/1993 | Larson et al. | 361/313 |
| 5,216,572 | 6/1993 | Larson et al. | 361/313 |
| 5,424,238 | 6/1995 | Sameshima | 437/60 |
| 5,536,672 | 7/1996 | Miller et al. | 437/919 |

OTHER PUBLICATIONS

Ramtron Corporation, R2 92490, Ramtron Brochure, RTx 0801 Ramtag™, 256–Bit Passive Nonvolatile RF/ID Tag Engineering Prototype, 1990, pp. 1–6.

Ramtron International Corporation, Ramtron Brochure, FM1208S Fram® Memory, 4,096–Bit Nonvolatile Ferroelectric RAM Product Specification, R3 Aug., 1993, pp. 1–8.

Ramtron International Corporation, Ramtron Brochure, Fram® Technology, R7 020993, pp. 1–2, 1993.

*Primary Examiner*—Chandra Chaudhari
*Attorney, Agent, or Firm*—Peter J. Meza; William J. Kubida; Holland & Hart LLP

[57] ABSTRACT

An integrated circuit capacitor and method for making the same utilizes a ferroelectric dielectric, such as lead-zirconate-titanate ("PZT"), to produce a high value peripheral capacitor for integration on a common substrate with a ferroelectric memory array also utilizing ferroelectric memory cell capacitors as non-volatile storage elements. The peripheral capacitor is linearly operated in a single direction and may be readily integrated to provide capacitance values on the order of 1–10 nF or more utilizing the same processing steps as are utilized to produce the alternately polarizable memory cell capacitors. The high value peripheral capacitor has application, for example, as a filter capacitor associated with the on-board power supply of a passive radio frequency ("RF") identification ("ID") transponder.

13 Claims, 7 Drawing Sheets

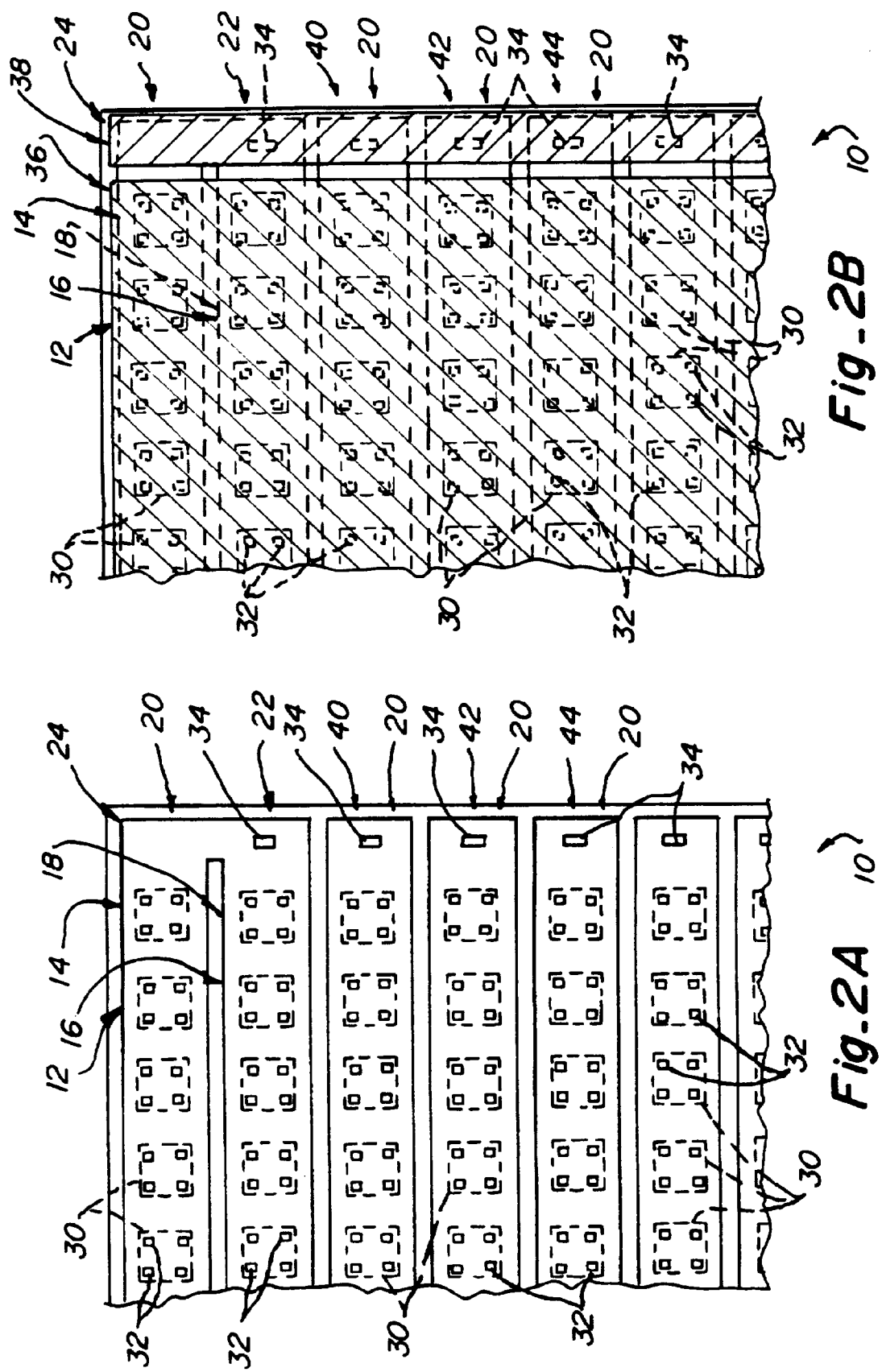

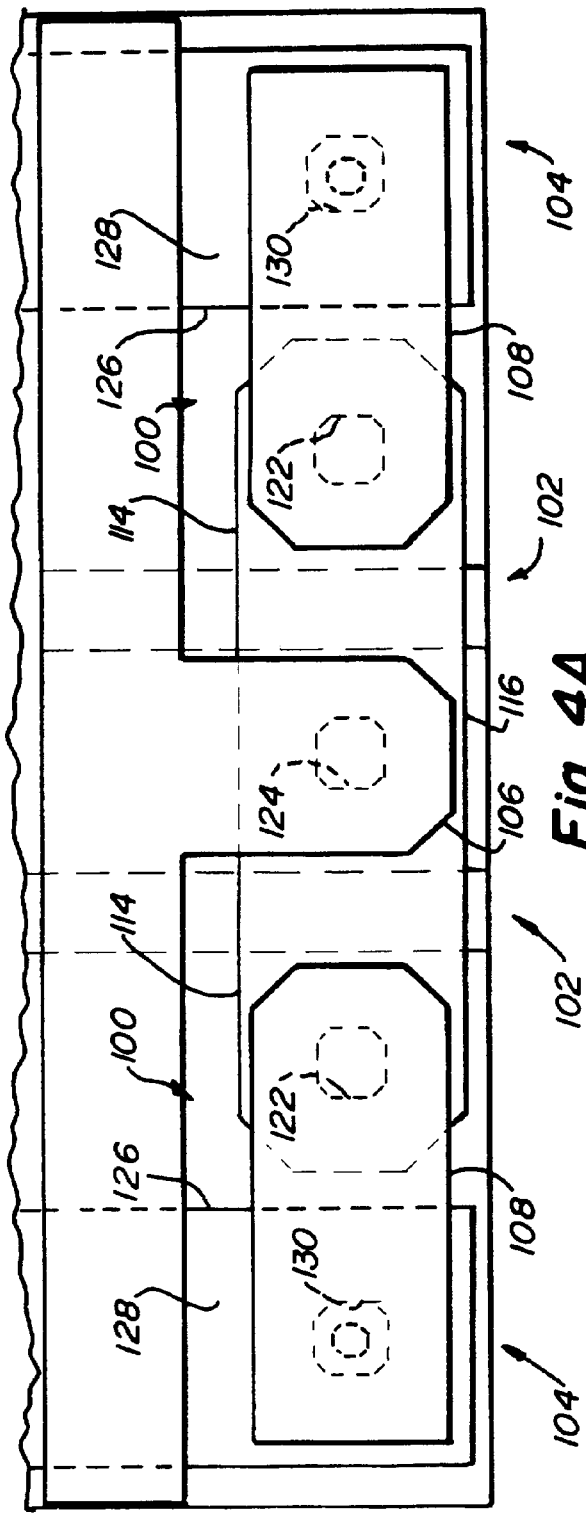
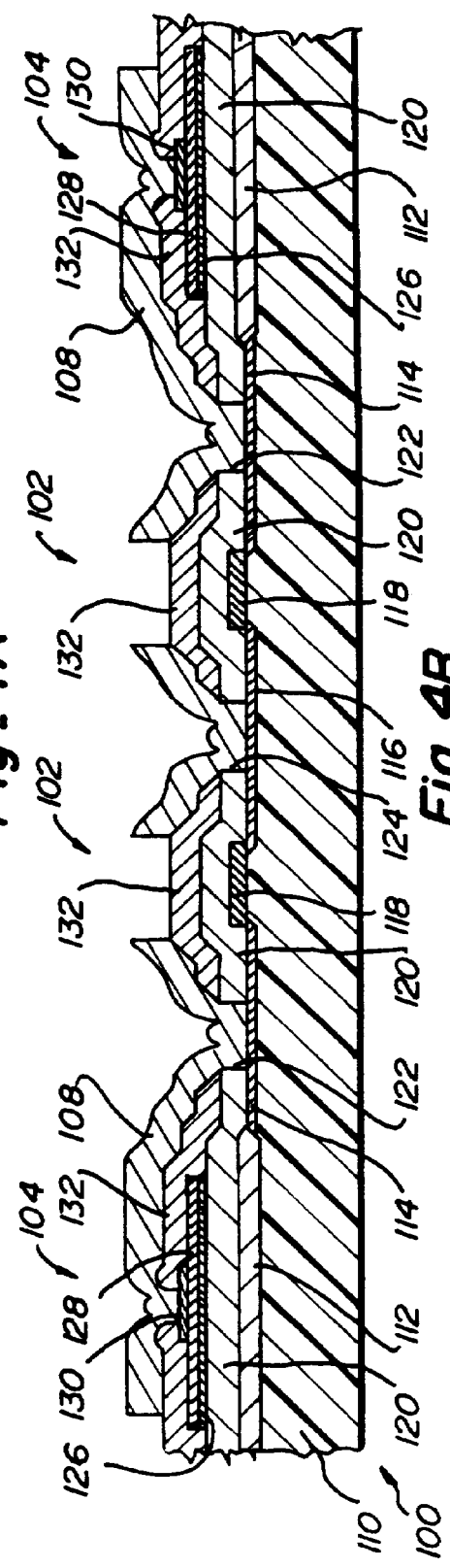
Fig. 4A
Fig. 4B

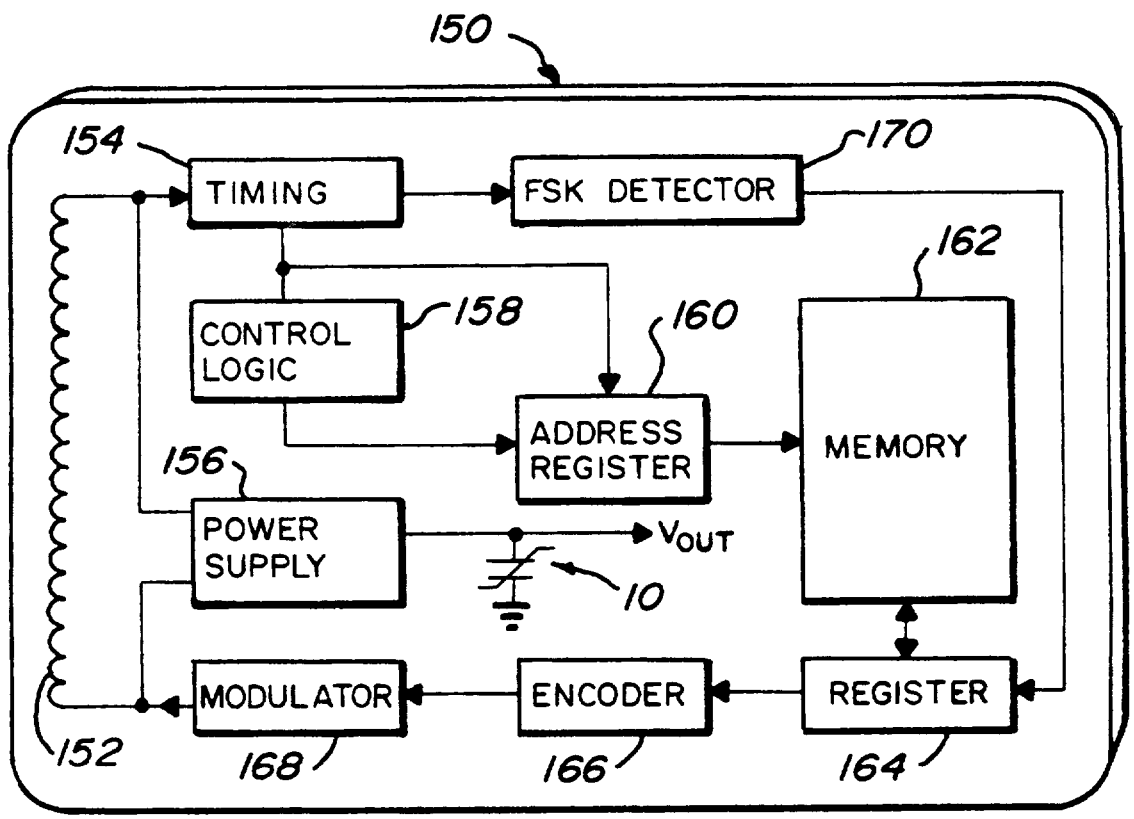
Fig_5

METHOD OF MAKING INTEGRATION OF HIGH VALUE CAPACITOR WITH FERROELECTRIC MEMORY

This is a continuation of application Ser. No. 08/525,497, filed on Sep. 8, 1995, which is a continuation of 08/194,706 (now abandoned), filed on Feb. 10, 1994.

BACKGROUND OF THE INVENTION

The present invention relates, in general, to techniques for the integration of a high value capacitor with a ferroelectric memory on a common substrate. More particularly, the present invention relates to an integrated circuit and process for forming a relatively high value capacitance in an integrated circuit which additionally includes at least one ferroelectric memory device cell and does not require any additional processing steps to produce the high value capacitor.

Modern data processing systems require that a substantial portion of the information stored in its memory be randomly accessible to ensure rapid access to such information. Due to the high speed operation of memories implemented in semiconductor technologies, random access memories ("RAMs") have been developed in which a bit of binary information is stored in a single memory cell, which may comprise but a single transistor and associated capacitor, with a multiplicity of memory cells being grouped together into an array. Commonly available RAMs utilizing typical integrated circuit capacitor dielectrics include both dynamic RAMs ("DRAMs") and static RAMs ("SRAMs"). SRAMs utilize a memory cell structure which includes a number of transistors configured as a flip-flop, or a device having two stable states. The bi-stable states of the device then define either a logic level "one" or "zero." Because SRAM cells require a larger number of transistors than DRAMs, the amount of on-chip "real estate" needed for each individual cell is relatively large and it is, therefore, difficult to integrate such devices as densely. However, an inherent advantage of SRAMs over DRAMs is that they do not require refresh circuitry to continually restore the charge in the memory cell capacitor and they are capable of operating with extremely fast access speeds.

As previously mentioned, DRAM memory cells store data in a capacitor which is formed in the substrate of the integrated circuit semiconductor material. Because the logic level determined by the charge is stored in a capacitor and not in the current state of a bi-stable logic device, the charge tends to dissipate and therefore needs to be refreshed periodically in order to preserve the memory contents.

In conventional single transistor DRAM memory cells, the charge stored in the memory cell capacitor is selectively coupled through the source-drain path of an access transistor to the memory bit line. The access transistor then also has its gate electrode coupled to a word line. By turning on the access transistor, the charge stored in the capacitor is coupled through the source-drain path to the bit line where it is generally compared against another charge reference, such as a dummy memory cell or complementary bit line, in order that the state of the memory cell indicated by the charge stored in the capacitor may be determined.

With the increasingly higher level of integration of DRAM devices, since they generally comprise the aforementioned one transistor/one capacitor type, the individual memory cells must be decreased in size to the limits of available processing technology. This in turn, has the effect of ultimately reducing the available capacitance of the capacitor in the memory cell. Thus, one of the greatest difficulties in achieving higher integration of DRAM devices is to increase the charge storage capacity of the individual memory cell capacitors despite the reduction of the lateral dimensions of the capacitor to allow for the fabrication of such higher density memory arrays. Since capacitance is inversely proportional to the separation between the two capacitor plates and directly proportional to the dielectric constant, the capacitance increase may be accomplished by reducing the thickness of the dielectric (typically silicon dioxide or silicon nitride) separating the two plates or by increasing the dielectric strength. The dielectrics used in DRAMs have an already inherently low dielectric constant and are also limited in how thin they can be fabricated.

In fact, the dielectric constant of these typical dielectric materials is so low that they are also totally unsuited for use in fabricating relatively large value peripheral capacitive elements on the same substrate as the memory cell capacitors, as may be required in specific applications. Such large value capacitors would necessitate a device having physical dimensions consuming sufficient on-chip "real estate" to substantially preclude their integration, if the same IC process is used.

Capacitance is also directly related to the dielectric constant of the material between the capacitor plates. Therefore, even though it is theoretically possible to manufacture such a large value capacitor on the same substrate as a conventional memory device using a separate, relatively higher dielectric constant material, as a practical matter, it is extremely undesirable to add the additional processing steps and materials to the memory device process flow in order to provide such a capacitor. Such relatively high value peripheral capacitors are, nevertheless, most desirably integrated on a common substrate with the memory device, in order to obviate the requirement of using discrete, off-chip capacitors for the same function.

Ramtron International Corporation of Colorado Springs, Colorado, assignee of the present invention, has pioneered the use of ferroelectric materials for use as the dielectric in memory cell capacitors. Ferroelectric materials exhibit an inherently high dielectric constant. RAMS using ferroelectric capacitors for memory cells, such as those utilized in Ramtron's FRAM® memory devices, also exhibit the significant advantage of being non-volatile. The non-volatility of ferroelectric RAMs is achieved by virtue of the fact that a ferroelectric capacitor includes a pair of capacitor plates with a ferroelectric material between them which has two different stable polarization states which can be defined with a hysteresis loop depicted by plotting the polarization against applied voltage. By measuring the charge which flows when a voltage is applied to a ferroelectric capacitor, the polarization state of the ferroelectric material can be determined. By arbitrarily assigning a logic level "zero" to one polarization state and a logic level "one" to the opposite polarization state, ferroelectric capacitors can be used to store binary information in a RAM memory array. The obvious advantage of a non-volatile memory is that data will continue to be stored within the memory cell even though power to the device may be interrupted or removed.

In accordance with the previously noted need for integrating a ferroelectric memory array with other associated circuitry on a common substrate, it is possible that a relatively high value peripheral capacitor, for example having a capacitance more than 100 to 100,000 times a typical memory cell capacitor such as for filtering supply voltages and the like, may be required. Utilizing conventional silicon dioxide and silicon nitride dielectric capacitors, the aforementioned inherent size constraints for fabricating such a relatively high value capacitor render integrating the same with a ferroelectric memory array prohibitive in terms of on-chip area and, as a consequence they must generally be furnished as discrete peripheral elements. Moreover, while ferroelectric capacitors have been utilized in a memory array cell, they have not heretofore been utilized to produce a linear integrated, high value peripheral capacitor for the integrated circuit.

SUMMARY OF THE INVENTION

The integrated circuit structure and process of the present invention results in a ferroelectric capacitor for utilization in a non-memory cell circuit application which may be constructed utilizing the same processing steps, and therefore, incorporating the same dielectric thickness, as is otherwise utilized in the manufacture of a ferroelectric memory cell capacitor on a common substrate therewith. The process and structure of the present invention results in a high value peripheral capacitor whose value is proportional to the area utilized and uses a ferroelectric dielectric having a high dielectric constant compared to that of silicon dioxide. In this manner, additional circuitry integrated with a ferroelectric memory array may incorporate relatively high value capacitors thereby obviating the necessity of furnishing them as discrete off-chip devices.

In a particular embodiment of the present invention, an integrated circuit is disclosed which comprises a memory device and a plurality of peripheral electronic elements formed on a common substrate therewith. The integrated circuit comprises at least one memory device cell wherein the memory device cell includes at least one ferroelectric memory capacitor. At least one additional ferroelectric peripheral capacitor is formed on the common substrate with the additional ferroelectric peripheral capacitor not forming a part of the memory device.

In a preferred embodiment, the ferroelectric memory and peripheral capacitors comprise a proprietary PZT compound dielectric layer and may be formed simultaneously utilizing the same process steps resulting in a ferroelectric dielectric of substantially equal thickness. The additional high value, ferroelectric peripheral capacitor may have application as a supply voltage filter capacitor or other applications requiring a relatively high value capacitance and is of particular utility in an integrated circuit embodiment of a radio frequency ("RF") identification ("ID") transponder.

An integrated circuit is further disclosed which includes a memory array having a plurality of ferroelectric memory cell capacitors capable of being polarized in opposite directions to store a charge therein representative of a logic "one" or logic "zero" value. The improvement of the present invention comprises, in combination, at least one additional capacitor formed on a common substrate with the memory array, with the additional capacitor having a ferroelectric dielectric being operated linearly.

Also disclosed is an integrated circuit capacitor which comprises a generally elongate bottom electrode formed on a substrate of the integrated circuit. A dielectric is substantially coextensive with the bottom electrode and in an overlying relationship thereto. A plurality of spaced apart top electrodes are disposed in an overlying relationship to the dielectric.

In accordance with a method of the present invention, a process for forming an integrated circuit capacitor is disclosed which comprises the steps of forming a generally elongate bottom electrode overlying the substrate and overlaying a generally coextensive dielectric layer on the bottom electrode. A plurality of top electrodes are formed on the dielectric layer with an insulating layer positioned on the dielectric layer substantially surrounding the top electrodes. The insulating layer has apertures therethrough overlying the top electrodes, through which the top electrodes may be contacted at the same time as the bottom electrode, by depositing a single conductive layer which is then patterned and etched to form separate electrical connections to the top and bottom electrodes respectively.

BRIEF DESCRIPTION OF THE DRAWINGS

The foregoing, and other features and objects of the present invention, and the manner of attaining them will become more apparent and the invention itself will be best understood by reference to the following description of a preferred embodiment taken in conjunction with the accompanying drawings, wherein:

FIG. 2A is a less highly magnified top plan view of the high value peripheral capacitor of FIG. 1A showing the integration of a greater plurality of parallel connected capacitors comprising additional linear elements and contiguous segments thereof;

FIG. 2B is a follow-on illustration of the same portion of the high value capacitor of FIG. 2A further illustrating the addition of a metalization layer as in FIG. 1B to provide electrical contact to the top and bottom electrode contacts of the plurality of parallel connected capacitors and the constituent linear elements and contiguous segments thereof comprising the high value peripheral capacitor of the present invention;

FIGS. 4A and 4B are, respectively, a partial top plan view and corresponding cross sectional view of a possible configuration for a pair of ferroelectric memory cells forming a portion of a ferroelectric memory array with which the high value peripheral capacitor of the preceding figures may be integrated utilizing the same processing steps, wherein the memory cells of the memory array comprise an access transistor and an associated ferroelectric memory capacitor; and FIG. 5 is an isometric view of a passive RF transponder depicting a possible implementation of the peripheral high value capacitor of the present invention as a power supply filter capacitor integrated on a common substrate with a ferroelectric memory array and other associated functional logic blocks.

DESCRIPTION OF A PREFERRED EMBODIMENT

Figure 1A:
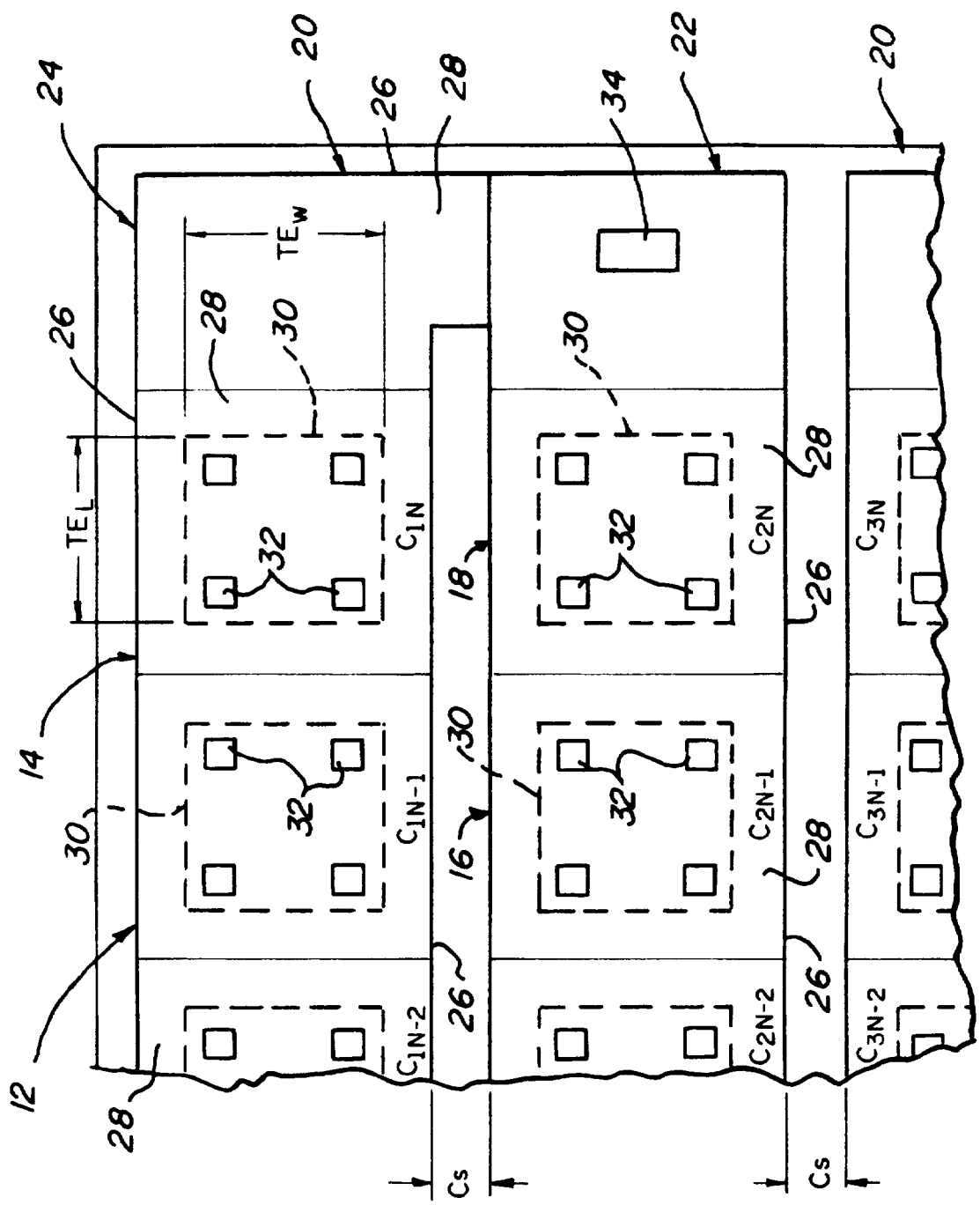
FIG. 1A is a highly magnified top plan view of a portion of an integrated circuit device illustrating the construction of a high value capacitor in accordance with the present invention comprising a plurality of parallel connected capacitors utilizing a linearly operated ferroelectric dielectric for integration on a common substrate with a non-volatile memory array incorporating ferroelectric memory cell capacitors as data storage elements.

With reference to FIG. 1A, a portion of a peripheral capacitor 10 in accordance with the present invention is shown. Peripheral capacitor 10 comprises, in pertinent part, an array of individual capacitors laid out in either linear elements or contiguous segments therewith comprising an array of capacitors ultimately to be connected in parallel such that the total capacitance of the peripheral capacitor 10 is equal to the sum of the capacitance of the individual capacitors in the array.

Peripheral capacitor 10 includes, a capacitor 12 ("$C_{1N-1}$") and a capacitor 14 ("$C_{1N}$") forming individual capacitive devices of linear element 20 comprising a number of capacitors $C_1$ through $C_{1N}$. Additionally shown is a capacitor 16 ("$C_{2N-1}$") and capacitor 18 ("$C_{2N}$") forming a portion of the capacitive devices of contiguous segment 22. Contiguous segment 22 comprises capacitors $C_2$–$C_{2N}$. The total capacitance of linear element 20 and contiguous segment 22 is then:

$$C_{total} = (\Sigma C_1 \ldots C_{1N} + \Sigma C_2 \ldots C_{2N})$$

Peripheral capacitor 10 may comprise any number of individual linear elements 20 having their bottom electrodes 26 interconnected by an additional conductive element, with or without associated contiguous segments 22, in the fabrication of a high value peripheral capacitor 10 in accordance with the present invention. As shown, linear element 20 is electrically connected to contiguous segment 22 at the bottom electrode 26 thereof by means of connecting structure 24.

Linear element 20 is separated in a parallel and spaced-apart manner from contiguous segment 22 by a distance $C_s$ between each of the individual capacitive devices thereof, which distance is dependent upon the capabilities of the process utilized. Other linear elements 20 or contiguous segments 22 are also separated by the same distance $C_s$ as shown.

By way of exemplary description with respect to capacitor 14, the structure of each of the remaining capacitive devices of the peripheral capacitor 10 may be determined inasmuch as each capacitor 12–18 of the peripheral capacitor 10 is like constructed.

The area of capacitors 12–18, in the embodiment shown, are defined by a linear length dimension of $TE_L$ and and a linear width dimension $TE_W$. Bottom electrode 26, may be in a preferred embodiment, comprised of platinum ("Pt"), platinum/titanium ("Pt/Ti") or other noble metal or alloys thereof. In like manner, the connecting structure 24 between linear element 20 and contiguous segment 22 comprises a conductive element formed at the same time as bottom electrode 26 as will be more fully described hereinafter.

Overlying bottom electrode 26 (as well as connecting structure 24) is a co-extensive ferroelectric layer 28 which, in a preferred embodiment, may comprise a lead-zirconate-titanate ("PZT") ferroelectric material proprietary to Ramtron International Corporation of Colorado Springs, Colorado. The ferroelectric layer 28 forms a dielectric material overlying bottom electrode 26 of capacitors 12–18. It should be noted that the ferroelectric layer 28 should not overlay the connecting structure 24 so as to allow connection to be made to the bottom electrode 26. A top electrode 30, which may have an area of $TE_L$ by $TE_W$, is formed on top of the ferroelectric layer 28. Top electrode 30 in a preferred embodiment may be the same material as that utilized to construct bottom electrode 26.

As will be more fully described hereinafter with respect to the process flow for fabricating the peripheral capacitor 10 of the present invention, a number of top electrode contacts 32 are formed to provide electrical connection to the top electrode 30 of the individual capacitive devices of the peripheral capacitor 10. In the embodiment shown, the top electrode contacts 32 comprise four individual, substantially square cross-sectioned contacts adjacent the corners of the top electrode 30. However, it should be clearly understood that any number of top electrode contacts 32 may be utilized and any desired configuration of one or more of the top electrode contacts 32 may likewise be employed.

In like manner, a bottom electrode contact 34 is provided to provide electrical contact to the bottom electrode 26 of the linear element 20 and contiguous segment 22 in conjunction with the connecting structure 24 therebetween. Bottom electrode contact 34 may be established utilizing the same processing steps to provide the top electrode contacts 32 as will be more fully described hereinafter. A single bottom electrode contact 34 may be employed, as shown, to provide contact to the bottom electrode 26 of a linear element 20 and associated contiguous segment 22 of the peripheral capacitor 10. Alternatively, a single bottom electrode contact 34 may be employed to provide electrical contact to the bottom electrode 26 of an individual linear element 20 comprising a number of capacitive devices.

Figure 1B:
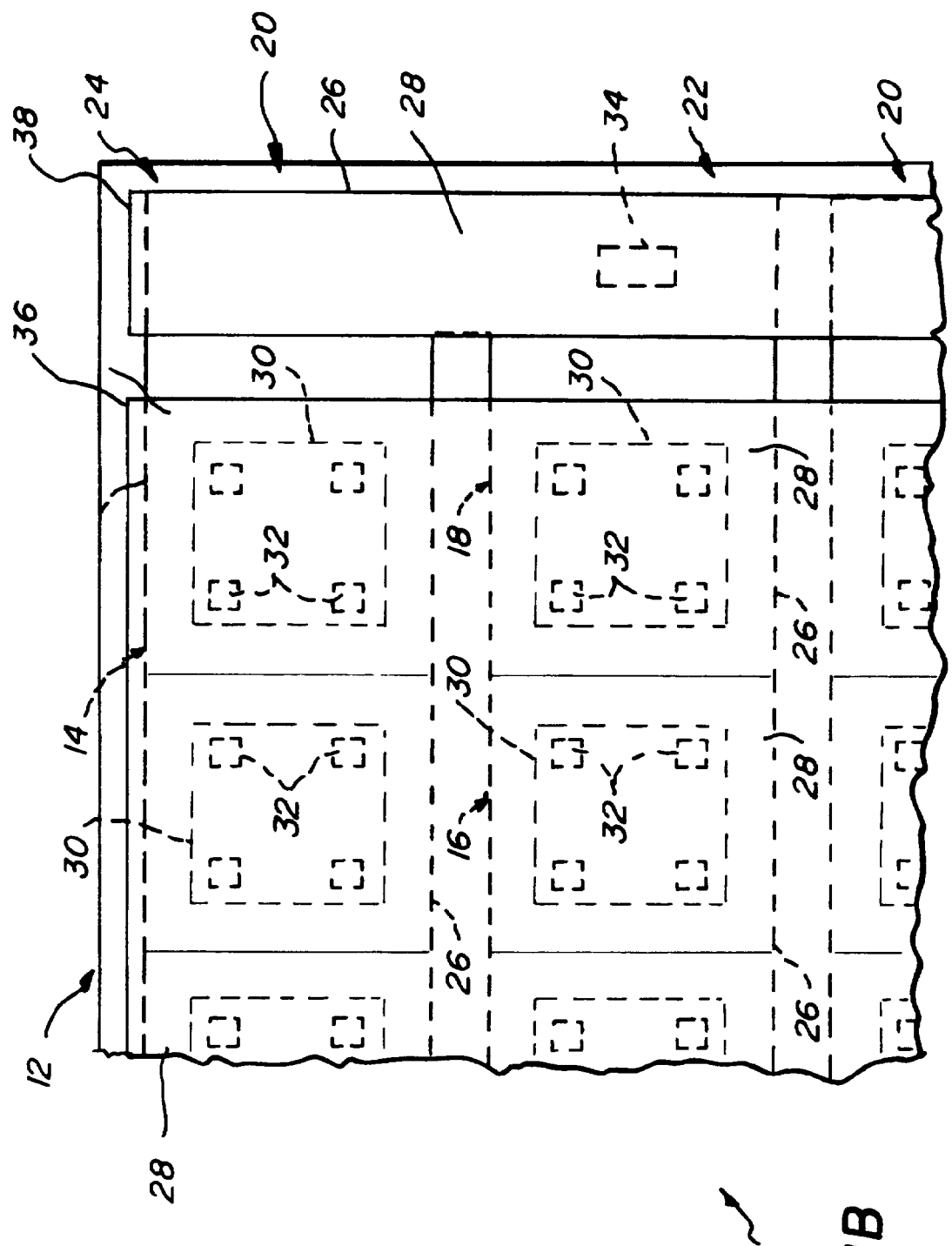
FIG. 1B is a follow-on illustration of the same portion of the high value capacitor of FIG. 1A further illustrating the addition of a metalization layer to provide electrical contact to the top and bottom electrode contacts of the plurality of parallel connected capacitors shown therein.

With reference additionally now to FIG. 1B, the portion of the peripheral capacitor 10 illustrated in FIG. 1A is shown in conjunction with an overlying metalization layer 36 formed to provide electrical connection between all of the top electrode contacts 32 of the individual capacitive devices comprising peripheral capacitor 10. In this manner, metalization layer 36 which may be, in a preferred embodiment, an aluminum ("Al") conductive layer provides one terminal for the total parallel capacitance of peripheral capacitor 10.

Also shown is a metalization layer 38 which is formed to provide electrical contact to the bottom electrode contact 34 as well as that of other bottom electrode contacts 34 of additional linear elements 20 and/or contiguous segments 22 comprising the peripheral capacitor 10. Electrical contact made between metalization layer 36 and metalization layer 38 would then comprise the parallel capacitance, ("$C$total") of all individual capacitive devices comprising the peripheral capacitor 10. Metalization layer 38 may also be formed utilizing the same processing step as is utilized to provide metalization layer 36.

With additional reference now to FIG. 2A, a larger portion of the peripheral capacitor 10 is shown including capacitors 12–18 of the linear element 20 and contiguous segment 22 previously described. In this further magnified view of the peripheral capacitor 10, additional linear elements 20 comprising capacitors 40 ("$C_3$–$C_{3N}$") capacitors 42 ("$C_4$–$C_{4N}$"), and capacitors 44 ("$C_5$–$C_{5N}$") are shown.

Referring additionally now to FIG. 2B, a larger portion of the peripheral capacitor 10 corresponding to that shown in FIG. 2A is illustrated to further depict the overlying metalization layer 36 connecting the top electrode contacts 32 as well as the metalization layer 38 providing electrical contact to a number of bottom electrode contacts 34. Utilizing the materials and layout of the peripheral capacitor 10 of the present invention, a high-value capacitance may be integrated on an integrated circuit substrate on the order of 1–10 nF or more consistent with the available on-chip real estate and peripheral capacitance requirements. When integrated in conjunction with a ferroelectric memory array formed on a common substrate therewith, the peripheral capacitor 10 of the present invention may be efficaciously produced utilizing the same processing steps as are used to construct the individual memory cell capacitors of the ferroelectric memory array. It should be noted that while the ferroelectric memory array cell capacitors may be oppositely polarized to store digital information representative of a logic level "one"

or "zero" in accordance with the properties of a ferroelectric dielectric, the individual capacitive devices of peripheral capacitor 10 are polarized in but a single direction, that is, operated linerally as a non-ferroelectric capacitor.

With reference now to FIGS. 3A–3H, a process sequence for the construction of the peripheral capacitor 10 of the present invention is shown. More particularly and as a representative example only, the process flow will ultimately establish capacitors 16 and 18 in conjunction with bottom electrode contact 34 of the connecting structure 24 illustrated in FIGS. 1A and 1B.

Figure 3A:
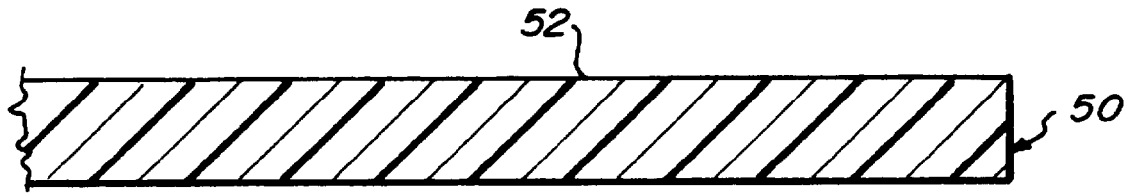
FIGS. 3A–3H illustrate a possible process flow for producing the high value capacitor of FIGS. 1A and 1B depicting the construction of a bottom electrode layer, dielectric layer and overlying top electrode layer thereof as well as the formation of interconnecting metalization layers for the top and bottom electrode contacts.

With particular reference to FIG. 3A, a substrate 50 is shown upon which the peripheral capacitor 10 and a ferroelectric memory device may be integrated. Substrate 50 may be composed of any basic semiconducting material such as silicon and silicon dioxide, germanium, gallium arsenide and the like. Substrate 50 may further be subjected to thermal oxidation or chemical vapor deposition ("CVD"). The substrate 50 may, of course, already be partially processed with other passive and/or active components or portions thereof. As shown, substrate 50 presents a substrate surface 52 for subsequent processing.

Figure 3B:
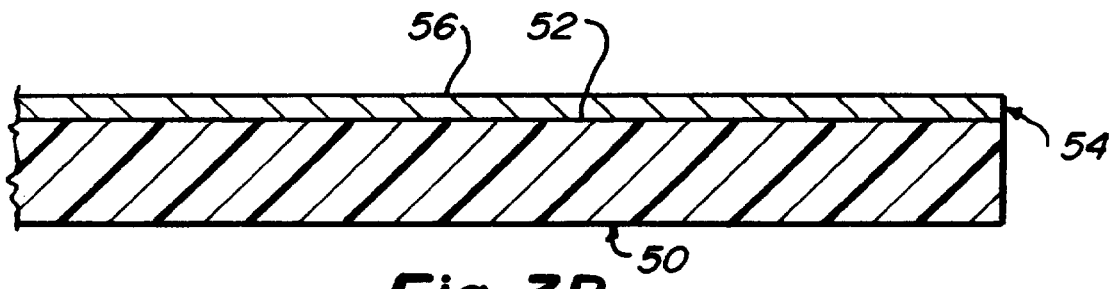

With reference particularly now to FIG. 3B, a bottom electrode layer 54 is shown as being applied to the substrate surface 52, and presenting a surface 56 oppositely disposed therefrom. The bottom electrode layer 54 can be established, for example, by deposition or other known processing techniques.

Figure 3C:
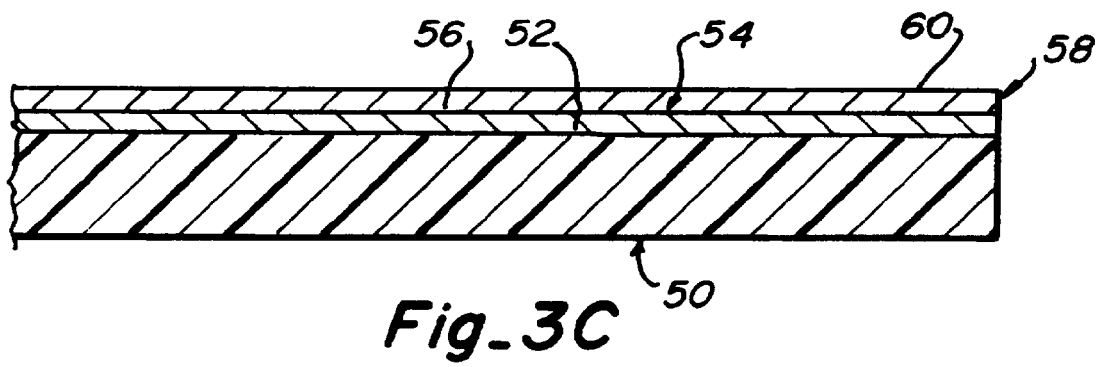

With reference now to FIG. 3C, a dielectric layer 58 is formed overlying the surface 56 of bottom electrode layer 54 and presents a dielectric surface 60 thereof. The dielectric layer 58 which, in a preferred embodiment, comprises a lead-zirconate-titanate thin film structure proprietary to Ramtron International Corporation having a chemical composition of $Pb(Ti_xZr_{1-x})O_3$, wherein x is in the range of 0.2 to 1.0. The dielectric layer 58 can be established by a number of known methods. The thickness of dielectric layer 58, when utilizing PZT, will be on the order of approximately 2,500–3,000 angstroms.

Figure 3D:
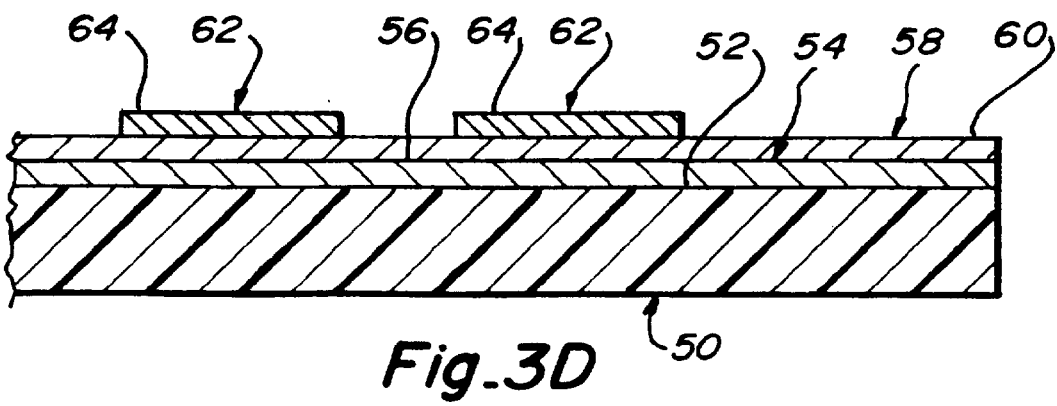

With reference additionally now to FIG. 3D, a top electrode layer 62 is formed on the dielectric surface 60 of dielectric layer 58 and patterned in subsequent processing steps to form a number of top electrodes as shown. The top electrode layer 62 may be established, for example, by deposition using the same method and material as used to form the bottom electrode layer 54. The top electrode layer 62 is then defined to produce the top electrodes of the peripheral capacitor 10. This definition process may be carried out by conventional semiconductor fabrication techniques such as photolithography and plasma etching, other anisotropic etch processes, wet etching or ion milling. The top electrode layer 62 leaves remaining surfaces 64 in the area of the capacitive devices forming the peripheral capacitor 10.

Figure 3E:
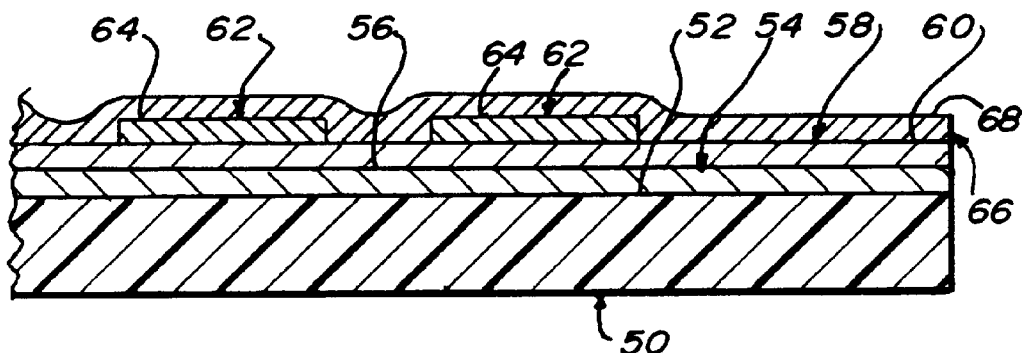

With reference additionally now to FIG. 3E, an insulating layer 66 is overlaid on the surfaces 64 of the top electrode layer 62 as well as the dielectric surface 60 of the dielectric layer 58. Insulating layer 66, which in a preferred embodiment may comprise silicon dioxide, can be established, by deposition processes such as CVD. Insulating layer 66, which may also be made of other insulating materials, presents an upper surface 68.

Figure 3F:
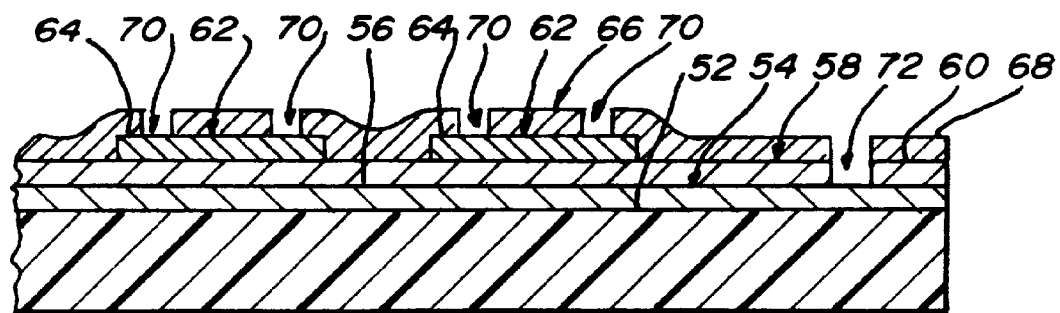

With reference additionally now to FIG. 3F, a number of top electrode contact apertures 70 are formed through the insulating layer 66 to the surfaces 64 of the top electrode layer 62 in the areas in which the capacitive devices of the peripheral capacitor 10 will be formed. Additionally, a bottom electrode contact aperture 72 is formed through the insulating layer 66 and dielectric layer 58 to provide access to the surface 56 of the bottom electrode layer 54. The bottom electrode contact aperture 72 is formed in the region of the connecting structure 24 illustrated in FIG. 1A. The top electrode contact aperture 70 and bottom electrode contact aperture 72 may be defined by conventional photo patterning and etching techniques.

Figure 3G:
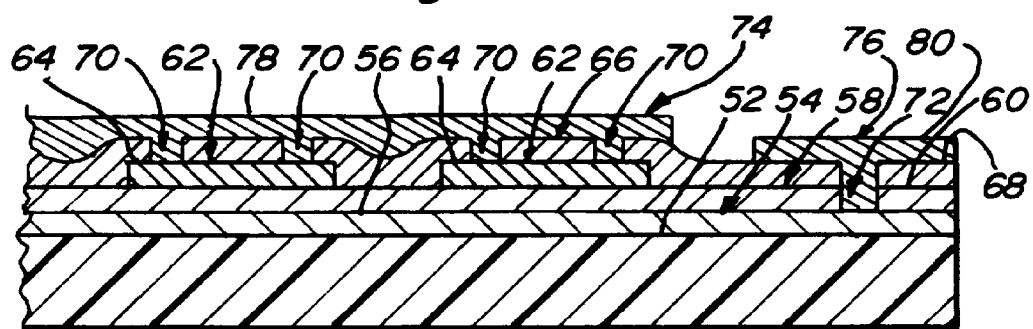

With reference now to FIG. 3G, a metalization layer 74 is formed over the upper surfaces 68 of the insulating layer 66 in the region of the top electrode layer 62 such that electrical contact is made with the top electrode layer 62 through the top electrode contact apertures 70. Metalization layer 74, which in a preferred embodiment may comprise aluminum, presents an upper surface 78 thereof. In like manner, a metalization layer 76 is formed in the region of the bottom electrode contact aperture 72 to provide electrical contact to the bottom electrode layer 54 through the insulating layer 66 and dielectric layer 58. Metalization layer 76 may be conveniently formed at the same time as metalization layer 74 to provide first and second terminal contacts to the various capacitive devices of the peripheral capacitor 10 through appropriate, known patterning techniques. It should be noted that other conducting structures may be utilized in lieu of an aluminum metalization layer such as a metal silicide, a doped polycrystalline silicon or other conductors. Metalization layer 76 presents an upper surface 80 thereof.

Figure 3H:
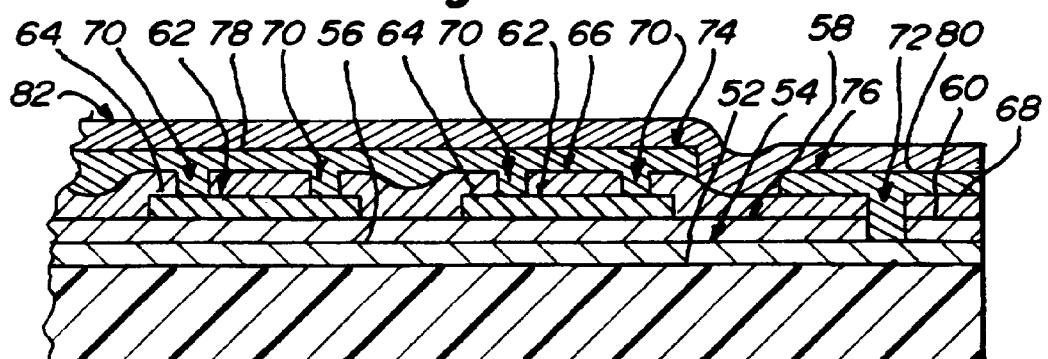

With reference additionally now to FIG. 3H, a passivation layer 82 has been applied overlying the metalization layers 74 and 76. The passivation layer 82 can be utilized to cover the entire surface of the integrated circuit comprising the peripheral capacitor 10 and any additionally integrated ferroelectric memory array by utilizing a non-semiconductor dielectric such as CVD glass or other insulating material to aid in protecting any exposed regions of the integrated circuit. As is known, the passivation layer would be removed from around any bonding or contacting pads of the resultant integrated circuit.

In general terms, capacitance varies directly with the dielectric constant of the dielectric material and inversely with the dielectric thickness. This can be represented to a first approximation by the following equation where: C is the resultant capacitance per unit area, $\epsilon_0$ is the dielectric constant of free space; $\epsilon_d$ is the dielectric constant of the dielectric material; and $d_{th}$ is the thickness of the dielectric.

$$C = (\epsilon_0 * \epsilon_d)/d_{th}$$

For silicon dioxide ($SiO_2$), the dielectric constant $\epsilon_d$ is approximately 3.9 with a typical thickness of about 250 Å. Therefore:

$$C = (\epsilon_0 * 3.9)/250 \text{ Å} = 0.02\epsilon_0$$

Ferroelectric dielectrics, such as PZT, typically have a dielectric constant in the range of $\epsilon_d = (1000–1500)$ and a thickness $d_{th}$ in the range of 2500 Å to 3000 Å. Consequently, choosing the upper range limit for the dielectric constant over the range of thicknesses:

$$C = (\epsilon_0 * 1500)/(2500 \text{ Å} - 3000 \text{ Å}) = 0.50\epsilon_0 => 0.60\epsilon_0$$

The ratio of the resultant capacitance between PZT and $SiO_2$ capacitors is then:

$0.50\epsilon_0 => 0.6\epsilon_0/0.02\epsilon_0 = 25/1 => 30/1$ or, twenty five or thirty-to-one.

As an example, since the typical $SiO_2$ DRAM capacitor has a cell capacitance of on the order of 50 fF (0.05 pF), such a capacitor would have to be enlarged 20,000 times to produce an effective 1 nF capacitor utilizing the same processing steps to integrate it on the same substrate. On the other hand, utilizing a ferroelectric dielectric instead, the same 1 nF capacitor could be made utilizing the same processing steps as are currently used to produce a PZT memory cell capacitor and be on the order of twenty five to thirty times smaller.

With reference additionally now to FIGS. 4A and 4B, a partial top plan view and corresponding cross-sectional view of a pair of memory cells 100 forming a portion of a ferroelectric memory array with which the peripheral capacitor 10 of the present invention may be integrated is shown. The peripheral capacitor 10 may be integrated utilizing the same processing step as are utilized to fabricate the memory capacitors 104 of the memory cells 100 of the integrated circuit ferroelectric array.

Memory cells 100 each comprise an access transistor 102 and associated memory capacitor 104. The access transistors 102 are shown having a common connected drain terminal thereof coupled to metalization layer 106. Local interconnects 108 couple the source terminals of the access transistors 102 to the associated memory capacitor 104.

Memory cells 100 of the ferroelectric memory array are formed on a common substrate 110 which, in a preferred embodiment is coextensive with the previously described substrate 50 of peripheral capacitor 10 and monolithic therewith. A relatively thick field oxide region 112 comprising silicon dioxide underlies each of the memory capacitors 104 as shown to preclude undesired parasitic effects. Source regions 114 and drain region 116 are formed in an upper surface of the substrate 110 by an implantation or diffusion of, for example, an N+ material when utilizing a P type substrate 110. Gates 118 of the access transistors 102 overlie the upper surface of substrate 110 adjacent the drain region 116 and corresponding source regions 114.

Overlying the field oxide regions 112 and gates 118 is an insulating layer which may comprise a reflow glass or other suitable insulating material. Source region contacts 122 of the local interconnects 108 and drain contact 124 of the metalization layer 106 contact the source regions 114 and drain region 116 respectively through apertures formed in the insulating layer 120.

The bottom electrodes 126 of the memory capacitors 104 are formed on top of the insulating layer 120 in a manner as previously described with respect to the peripheral capacitor 10. Bottom electrode 126 may comprise platinum or a titanium/platinum alloy. Overlying bottom electrodes 126, and generally coextensive therewith, are formed dielectric layers 128 in a manner previously described with respect to the peripheral capacitor 10. Dielectric layers 128 may comprise a PZT ferroelectric material. Top electrodes 130 of the memory capacitors 104 are formed on top of the dielectric layers 128 as previously described. Top electrodes 130 may comprise, for example, platinum or other noble metal. Overlying the structure of memory capacitors 104 and the insulating layer overlying access transistors 102 is formed an additional insulating layer 132 through which contact is made to the top electrodes 130 by means of the local interconnects 108.

With additional reference now to FIG. 5, the peripheral capacitor 10 of the present invention may be integrated as a power supply voltage filter capacitor forming part of an integrated circuit which also includes a ferroelectric memory array 162 and other associated logic blocks utilized to construct a passive RF/ID transponder 150. By integrating the peripheral capacitor 10 with the ferroelectric memory array 162 (comprising a plurality of the memory cells 100 shown in FIGS. 4A and 4B), the passive RF/ID transponder 150 may be manufactured in a card-sized form factor having approximate physical dimensions of 3.375 inches (85.7 mm) by 2.125 inches (54.0 mm) by 0.030 inches (0.76 mm).

Passive RF/ID transponder 150 comprises, with respect to its primary functional elements, an antenna 152 (which may be a conductive coil external to the integrated circuit) for receiving an FSK modulated signal from an associated controller. Antenna 152 is also utilized to transmit a signal back to the controller indicative of information stored in the ferroelectric memory array 162 or otherwise "hardwired" in passive RF transponder 150. Signal output from the antenna 152 is applied to a timing circuit 154 for deriving a clock signal from the received FSK modulated RF signal and supplying the same to the FSK detector 170 as well as to a control logic circuit 158 and an address register 160. A source of power (Vout) for the passive RF transponder 150 is derived by a power supply 156 utilizing the electromagnetic energy in the received FSK modulated RF signal. The peripheral capacitor 10, which in the depicted application may have a nominal value of approximately 1.0–10 nF, couples Vout to the integrated circuit ground to serve a power supply filtering function.

The control logic circuit 158 controls the functionality of the passive RF transponder 150 and is utilized to selectively address specific word locations within the memory array 162 by means of the address register 160. Data representing commands or information data detected by means of the FSK detector 170 is supplied to a register 164 to allow data to be either written to or read out from the memory array 162 at the address determined by the address register 160. Information to be transmitted back to the associated controller is held in the register 164 and subsequently encoded by means of encoder circuit 166 for output to a modulator circuit 168. The output of the modulator circuit 168 is supplied to the antenna 152 for transmission back to the associated controller.

While there have been described above the principles of the present invention in conjunction with specific structure and processes, it should be clearly understood that the foregoing description is made only by way of example and not as a limitation to the scope of the invention. For example the peripheral high value capacitor may be laid out with a single square structure in lieu of the elongate structure shown. Moreover, while the peripheral high value capacitor of the present invention has been described with respect to a flat, or planar device, it may also be fabricated as a trench or stacked capacitor as well.

What is claimed is:

1. A process for forming an integrated circuit capacitor comprising the steps of:

providing a substrate;

firstly forming a generally elongate bottom electrode overlying said substrate;

firstly overlaying said generally elongate bottom electrode with a generally coextensive dielectric layer;

secondly forming a plurality of top electrodes on said dielectric layer;

secondly overlaying an insulating layer on said dielectric layer substantially surrounding said plurality of top electrodes, said insulating layer having apertures therethrough overlying said top electrodes; and contacting said bottom electrode with a first conductive layer and a multiplicity of said plurality of said top electrodes with a second conductive layer respectively.

2. The process of claim 1 wherein said step of contacting is carried out by the deposition of aluminum.

3. The process of claim 1 wherein said step of firstly forming comprises the steps of:

depositing a layer of electrode material on said substrate;

placing photoresist on said layer of electrode material;

patterning said photoresist to define said generally elongate bottom electrode;

setting said patterned photoresist;

removing said electrode material surrounding said patterned photoresist; and stripping away said patterned photoresist.

4. The process of claim 3 wherein said step of depositing is carried out by means of platinum.

5. The process of claim 3 wherein said step of patterning is carried out by defining a substantially linear element.

6. The process of claim 5 wherein said step of patterning is further carried out by defining at least one additional bottom electrode segment contiguous to said substantially linear element.

7. The process of claim 1 wherein said step of firstly overlaying is carried out by means of a ferroelectric.

8. The process of claim 1 wherein said step of secondly forming comprises the steps of:

depositing a layer of electrode material on said dielectric layer;

placing photoresist on said first layer of electrode material;

patterning said photoresist to define said plurality of top electrodes;

setting said patterned photoresist;

removing said electrode material surrounding said patterned photoresist; and stripping away said patterned photoresist.

9. The process of claim 8 wherein said step of depositing is carried out by means of platinum.

10. The process of claim 8 wherein said step of patterning is carried out by defining a plurality of spaced apart, substantially rectangular elements.

11. The process of claim 1 wherein said step of secondly overlaying is carried out by producing a silicon dioxide layer on top of said dielectric layer and said top electrodes.

12. The process of claim 1 wherein said step of contacting comprises the steps of:

placing photoresist on said insulating layer;

patterning said photoresist generally surrounding said plurality of top electrodes;

setting said patterned photoresist;

removing said insulating layer overlying said top electrodes;

stripping away said patterned photoresist; and depositing said second conductive layer overlying said insulating layer and contacting said plurality of top electrodes.

13. The process of claim 12 wherein said step of depositing is carried out by means of platinum.

* * * * *